United States Patent [19]

Green et al.

[11] Patent Number: 5,039,851

[45] Date of Patent: Aug. 13, 1991

[54] PLUG IN DETECTOR MODULE

[75] Inventors: Joan M. Green, Sutton; John W. Gray, Ware, both of Mass.

[73] Assignee: Galileo Electro-Optics Corporation, Sturbridge, Mass.

[21] Appl. No.: 527,187

[22] Filed: May 23, 1990

[51] Int. Cl.[5] .......................... H01J 40/14; H05K 7/02

[52] U.S. Cl. .................................... 250/207; 361/417; 361/420; 313/103 CM

[58] Field of Search ............................... 250/207, 299; 313/103 CM, 105 CM; 361/399, 400, 417, 419, 420

[56] References Cited

U.S. PATENT DOCUMENTS

| | | | |
|---|---|---|---|
| 3,771,024 | 11/1973 | Dumas | 361/417 |
| 4,761,712 | 8/1988 | Ito et al. | 361/419 |
| 4,801,916 | 1/1989 | Kaindl et al. | 361/417 |
| 4,987,335 | 1/1991 | Yamamoto et al. | 250/207 |

*Primary Examiner*—David C. Nelms
*Assistant Examiner*—Michael Messinger
*Attorney, Agent, or Firm*—Watson, Cole, Grindle & Watson

[57] ABSTRACT

A modular channel electron multiplier mounting arrangement for an analytical instrument, which reduces the labor required for assembly and, at the same time, results in a more rigid structure with lower susceptibility to microphonic noise has been developed. A circuit board and an attached end support has slotted portions for engaging support studs on the instrument. A channel electron multiplier is mounted on the circuit board by means of supporting hardware. Printed circuit wiring on the circuit board carries signal and high voltage to receptacles on the circuit board which when installed in the instrument are aligned for securely engaging leads in the instrument. The end support and the receptacles rigidly support the assembly in the instrument such that microphonics noise is significantly reduced.

12 Claims, 5 Drawing Sheets

PLUG IN DETECTOR MODULE

BACKGROUND OF THE INVENTION

The invention relates to ion detectors for mass spectrometry.

Historically, electron multiplier detectors, whether of the discrete or continuous dynode types, have been assembled in a ceramic and stainless steel housing by means of wires and mounting brackets. It has been generally believed that these materials are required in order to optimize performance in a vacuum environment (e.g., pumping speed, background noise level, etc.). These types of assemblies are typically highly labor intensive and also suffer from induced microphonics noise on the output signal. Microphonics results from vibration of the signal and power leads caused by the pumping system or other equipment. The mechanical vibration induces electrical noise pulses which are picked up on the signal lead and are subsequently amplified by the instrument electronics. This phenomenon results in an inherent limitation on the signal-to-noise performance of the instrument.

In some prior arrangements a vacuum compatible circuit board carrying discrete components has served as a support for a channel electron multiplier (CEM). Here the CEM is secured to the circuit board by straps that are epoxied to the board. External leads supply the CEM and circuit components, and the board is secured in placed by screws. This arrangement is also labor intensive because connections to other circuit components and the inputs and outputs and mounting of the circuit board on screw posts is done by hand.

SUMMARY OF THE INVENTION

A modular plug in channel electron multiplier mounting arrangement for an analytical instrument, which reduces the labor required for assembly and, at the same time, results in a more rigid structure with lower susceptibility to microphonic noise has been developed. The arrangement comprises a circuit board formed with a ground plane having an end portion. A conductive end support having slotted portions is attached to the end portion of the circuit board in contact with the ground plane. The slotted portions engage support studs on the instrument, which end support is secured by means of fasteners engaging the studs for supporting the circuit board in a first plane. A channel electron multiplier is mounted on the circuit board by means of supporting hardware. Printed circuit wiring traces on the circuit board carry signal and high voltage to corresponding lead locations on the instrument. Pin jacks secured to the board connect the traces to the instrument leads and support the board in a plane transverse to the first plane. The circuit board which when installed in the instrument is aligned in and rigidly secured therein so that microphonics noise is significantly reduced.

DESCRIPTION OF THE PREFERRED EMBODIMENT

Figure 1:
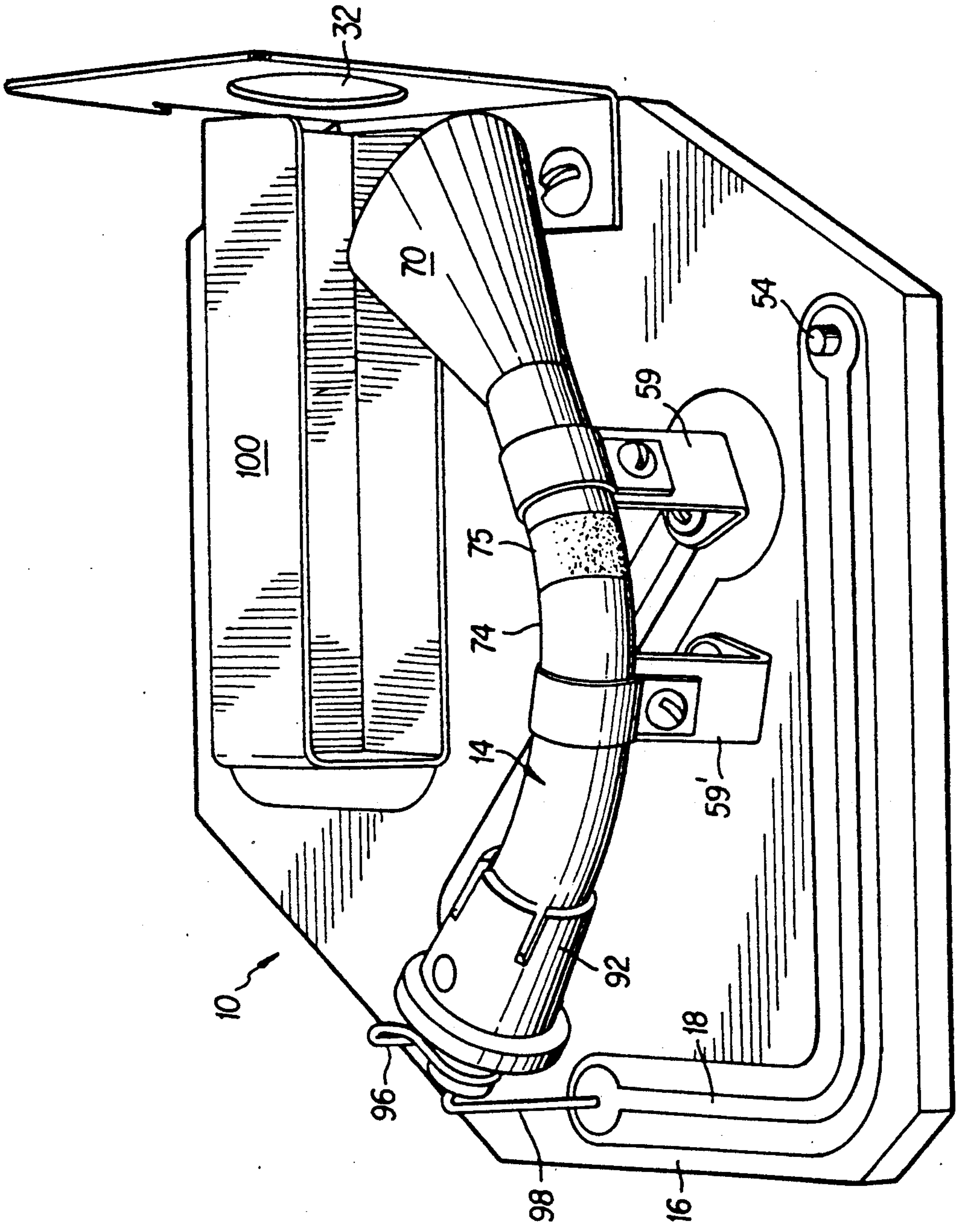
FIG. 1 is a perspective view of the modular detector assembly of the present invention.
Figure 2:
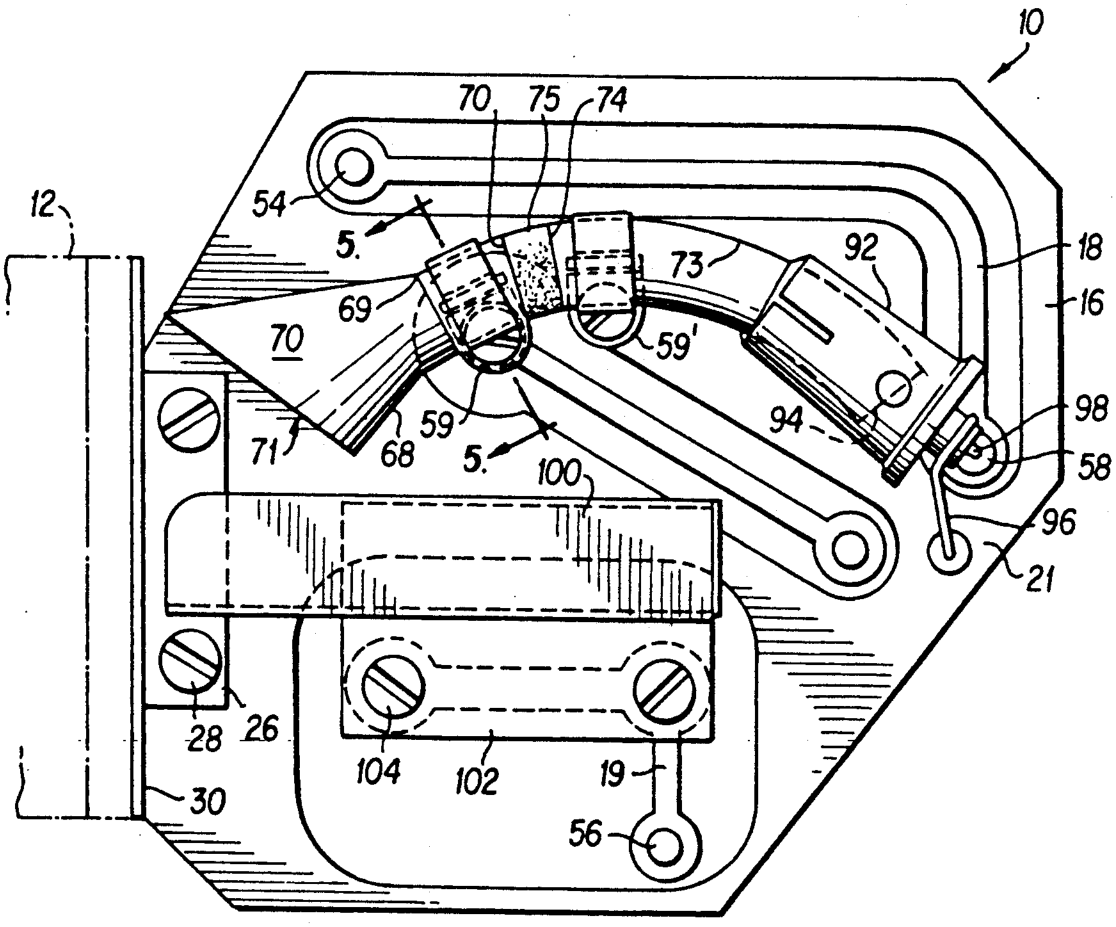
FIG. 2 is a plan view of the detector assembly of the present invention located in an analytical instrument, portions of which are shown in phantom line.
Figure 3:
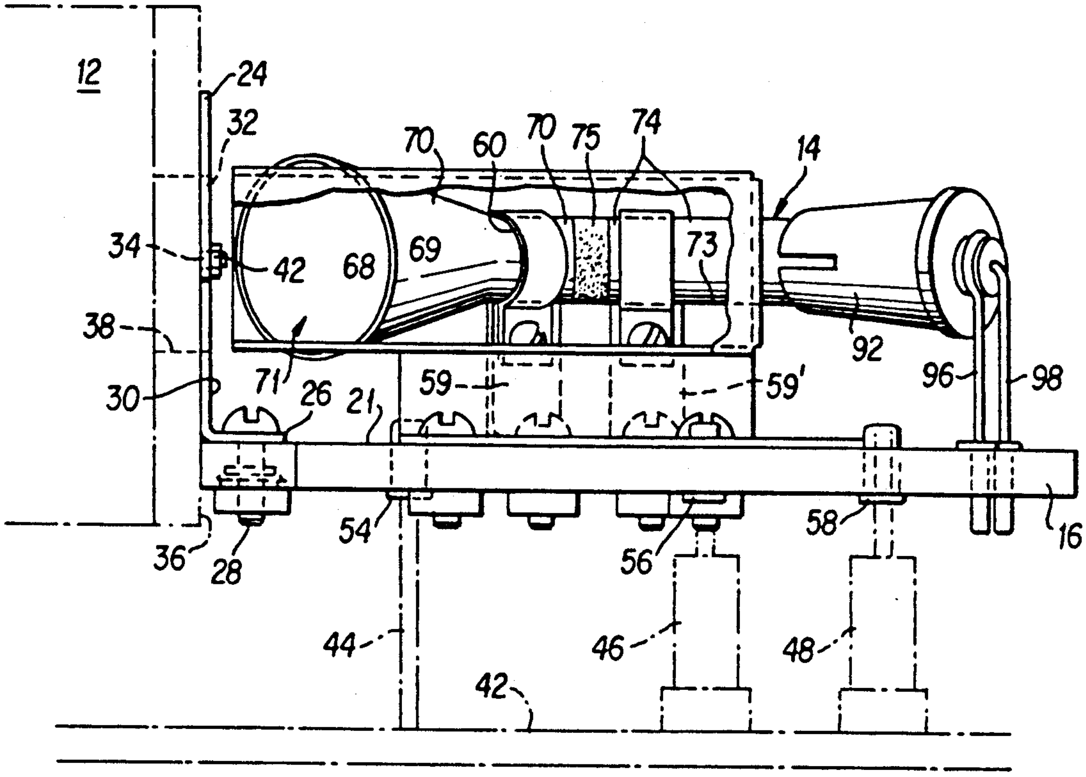
FIGS. 3 and 4 are respective side and end views of the detector assembly shown in FIG. 2.
Figure 4:
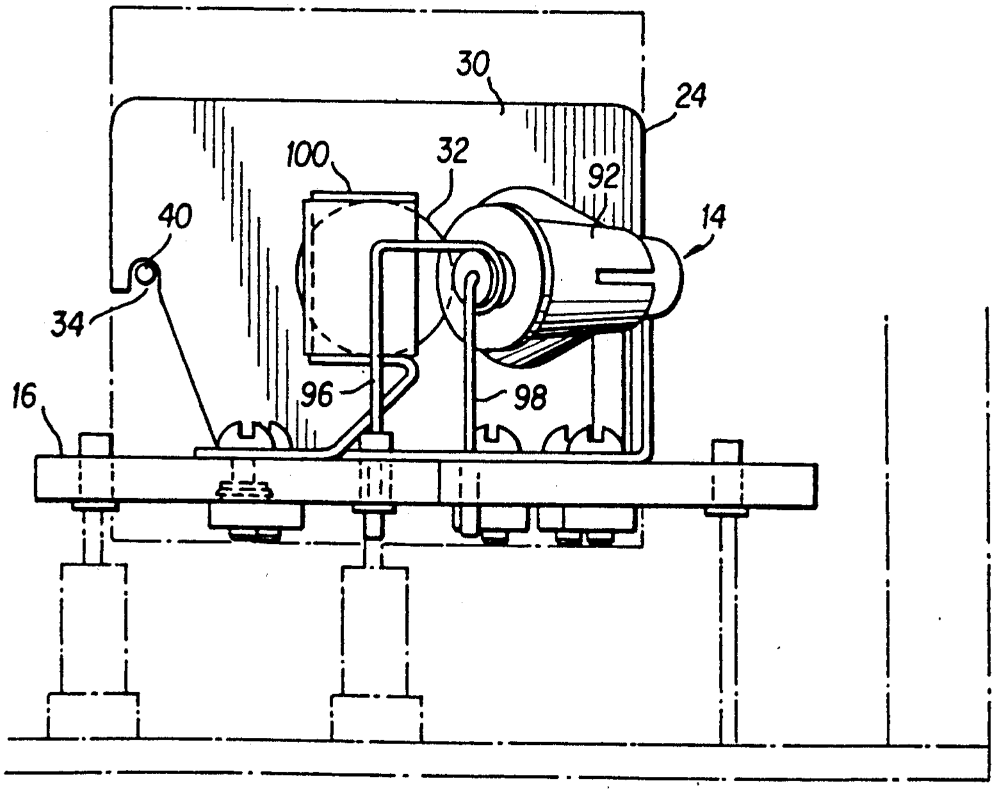

A modular plug in channel electron multiplier (CEM) detector 10 for use with an analytical instrument such as a mass spectrometer 12 is illustrated in FIGS. 1-5. The mounting arrangement 10 reduces the labor required for assembly and, at the same time, results in much more rigid structure with lower susceptibility to microphonics noise.

The detector 10 comprises a channel electron multiplier 14 mounted to a vacuum compatable circuit board 16. Printed circuit track 18 formed on the board 16 carries signal, and tracks 19 and 20 carry high voltage for ion deflection and electron multiplication. Remaining portions of the board carry a printed ground plane 21.

A conductive end support member 24 is secured at one end 26 to the circuit board 16 in electrical contact with the ground plane 21 by means of an appropriate fastener 28. An upstanding wall portion 30 having an aperture 32 and support slots 34 therein abuts the end 36 of the instrument 12 as shown. An aperture 38 in the instrument wall 36 is aligned with the aperture 32 in the wall portion 30. Threaded support studs 40 extend from the wall 36 and are aligned with slots 34 in the wall portion 30. Hand tightenable fasteners 42 are threaded on to the studs 40 for securing the input end of the detector 10 against the wall 36 of the instrument 12 in a vertical plane as shown. The ground plane 21 is grounded to the instrument 12 by means of the end support 24.

The instrument 12 has a number of flying leads 44, 46 and 48 which are located in preselected fixed positions therein. The flying leads are adapted to registerably engage mating receptacles or pin jack connectors 54, 56 and 58 mounted in the circuit board 16. The flying leads 44-48 frictionally engage the pin jacks 54-58 and support the circuit board 16 in a horizontal plane transverse to the vertical plane of the wall 36, such that the detector 10 is rigidly supported and restrained against vibration.

Figure 5:
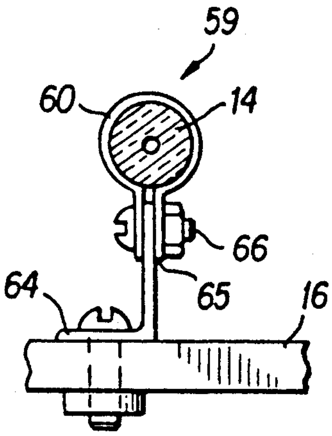
FIG. 5 is a sectional view of the detector assembly of the present invention taken along line V—V of FIG. 2.

Conductive supports 59-59' secure the electron multiplier 14 to the circuit board 16 in spaced relationship with the plane of the circuit board 16 and aligned with the aperture 38 in the instrument 12. The conductive supports 59-59', one of which is detailed in FIG. 5, include a cylindrical clip or collar 60 which circumferentially engages the electron multiplier 14. The collar 60 has apertured tabs 62. An L-shaped bracket 64 having an apertured free end 65 is secured to the circuit board 16. The bracket 64 is secured at its free end 65 to the tabs 62 by means of a fastener 66. In the arrangement illustrated, one of the supports 59 is secured to the channel electron multiplier near the cone portion 68 and adjacent neck portion 69 as illustrated. These areas are plated with a conductive input electrode coating 70 and carry high voltage for biasing the CEM at its input end 71 so that electron multiplication may be initiated. The L-shaped bracket 64 is secured to the circuit board 16 in contact with the high voltage track 20. The other support 1 59' formed of the same components as illustrated in FIG. 5 is secured to the channel electron multiplier 14 in the curved region 73. An output electrode 74 in contact with the fastener 72 is formed as a conductive coating on the CEM 14 in this region and extends to the output end 75. The input and output electrodes 70–74 are separated by a non-conductive region 75. The support 59' secures the CEM to the circuit board 16 and electrically couples the output electrode 74 to the ground plane 21. A collector electrode 92 is secured to the output end 94 of the multiplier 14. A ground wired 96 is coupled to the output electrode 92 and to the ground plane 21. The signal wire 98 is coupled to the signal trace 18.

Ion deflector 100 is located adjacent the output 38 of the instrument 12. The deflector 100 is secured to the circuit board 16 by means of a bracket 102 and fasteners 104 which pass through the openings therein. A high voltage track 19 is located on the circuit board 16 immediately below the bracket 102 and makes contact therewith. A high voltage provided by the lead 46 and coupled to pin jack 56 at the end of the track 19 thus maintains the ion deflector 100 at a selected voltage level.

Experimental results comparing a standard detector (not shown) and the modular plug in detector 10 manufactured in accordance with the present invention indicates that microphonics noise or counts is reduced by at least 20 fold at low mass numbers in the order of 45–55. At higher mass numbers the microphonics noise relative to the standard detector are even further reduced.

Figure 6:
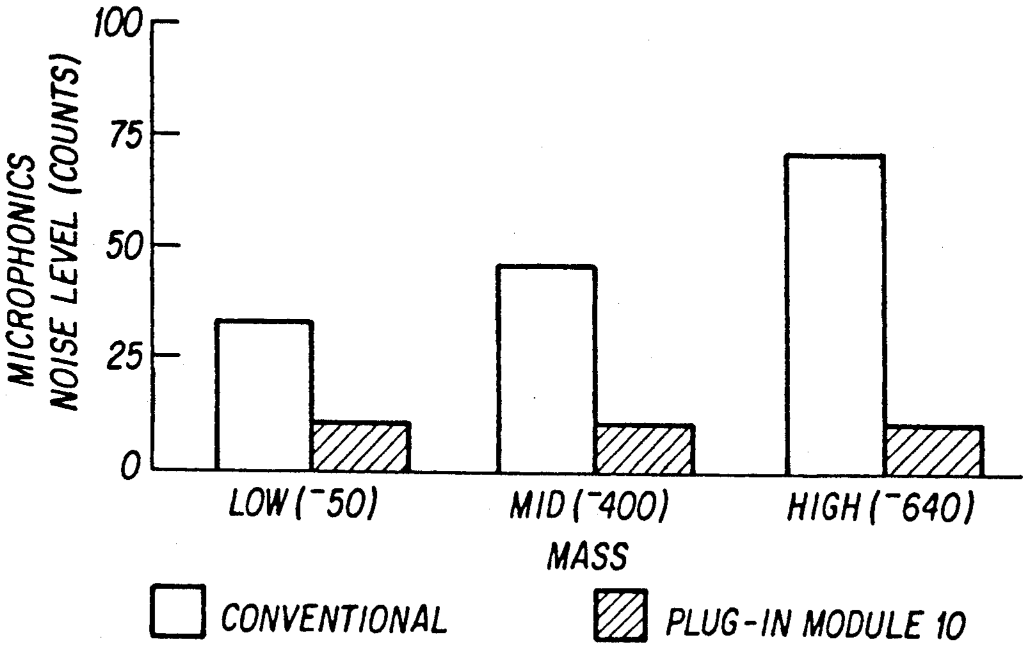
FIG. 6 is a plot of microphonics noise versus mass comparing a conventional detector and a detector according to the invention.

FIG. 6 represents a plot of microphonics noise level versus mass in atomic mass units (AMU) of a detector mounted on an instrument in a conventional manner and a modular plug in detector according to the invention. In the invention, the average microphonics noise is reduced from about thirty counts to about 10 counts at 50 AMU. At higher AMU levels the noise remains at about 10 counts whereas in the conventional detector the noise averages near 70 counts average. The noise level recorded with the detector according to the invention is lower than conventional detectors on a consistent basis.

Figure 7D:
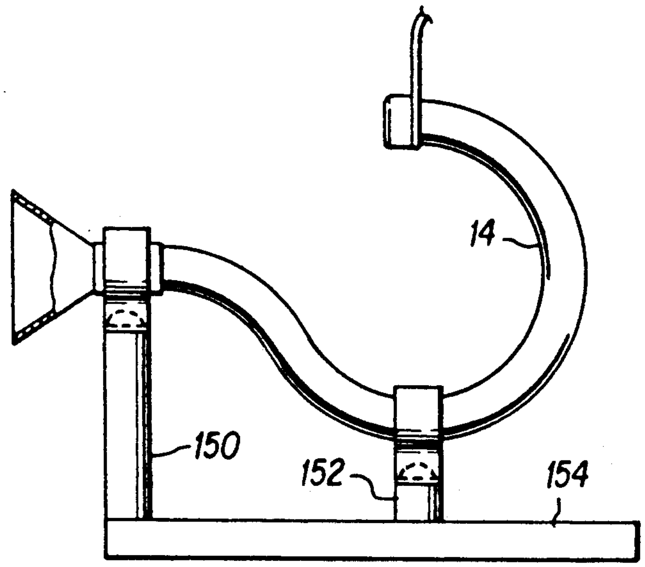
FIGS. 7A, 7B, 7C, 7D, and 7E are illustrations of alternative embodiments of the invention employing snap in supports for the detector.
Figure 7E:
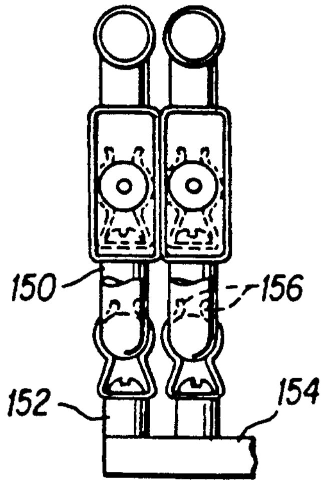
Figure 7A:
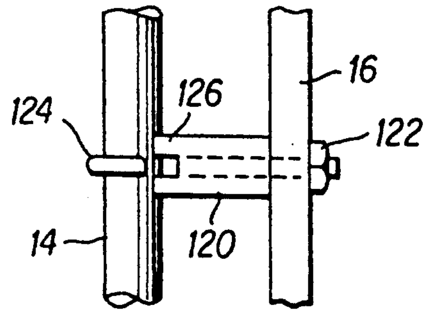
Figure 7B:
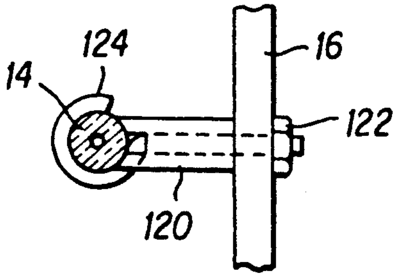
Figure 7C:
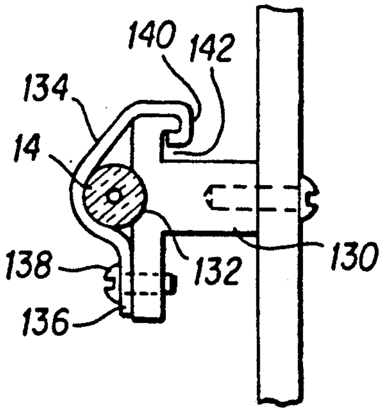

FIGS. 7A–7D illustrate alternative embodiments of the support for the CEM 14. In FIGS. 7A and 7B a support 120 is secured to the circuit board by a stud and bolt 122 and the CEM 14 is secured between a spring clip 124 and cleat 126 at the free end. In FIG. 7C the support 130 captures the CEM 14 between recessed top end 132 and strap 134. One end 136 of the strap 134 is secured to the support 130 by the fastener 138. The other end 140 of the strap engages a recess 142 in the underside of the top end 132. In FIGS. 7D–7E a plurality of spring clips 150-152 secure the CEM 14 to support 154. The clips 150-152 have resilient opposed fingers 156 which capture the CEM therebetween like a fuse clip. The spring clips 150-152 may act as fixed electrode leads for the CEM. Other clips, latches or connectors which allow for easy removal of the CEM 14 are contemplated.

Figure 8:
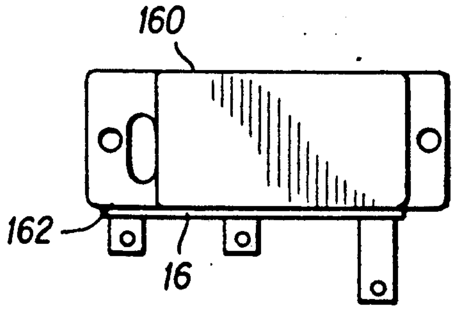
FIG. 8 is a detail of a detector shield box.

FIG. 8 illustrates a cover 160 secured about the edge 162 of the circuit board 16. The cover 160 shields the CEM 14 from residual gas in the instrument which may give rise to UV photons which can cause spurious background noise.

While there has been described what at present is considered to be the preferred embodiment of the present invention it will be apparent to those skilled in the art that various changes and modifications may be made therein without the departing from the invention and it is intended in the appended claims to cover all such changes and modifications as forward in the true spirit and scope of the invention.

What is claimed is:

1. A modular detector for reducing microphonics noise in a measuring instrument having mechanical supports and electrical leads in predefined spaced relationship comprising:

a channel electron multiplier (CEM);

a circuit board;

electrically conductive mounting means for securing the CEM to the circuit board in spaced-relationship;

printed circuit tracks on the circuit board for attachment to the mounting means at one end and extending at the other end to locations registerably corresponding spatially to the spatial relationship of the electrical leads of the instrument;

receptacle means on the circuit board at said other ends of the electrical traces for engaging the electrical leads of the instrument and supporting the detector in a plane; and the circuit board for engaging the mechanical support of the instrument in a plane transverse to the first mentioned plane to thereby rigidly support the modular detector in the instrument for reducing microphonics.

2. The apparatus according to claim 1 further comprising detector electrode means for the CEM and leads secured between the electrode means and the tracks.

3. The apparatus according to claim 1 wherein the circuit board comprises a ground plane surrounding the tracks and being in electrical contact with the mounting means for providing a common electrical connection with the instrument and the CEM.

4. The apparatus according to claim 1 further comprising ion deflector means mounted opposite an input of the CEM and being electrically connected to a track for maintaining a potential for deflecting ions produced in the detector.

5. The apparatus according to claim 1 wherein the mounting means for the channel electron multiplier comprises circular collar for the CEM having tab portions at opposite ends thereof and apertures therein and bracket means secured to the printed circuit board having an aperture in a free end thereof for alignment with the apertures in the collar and fastener means for securing the tabs to the bracket means.

6. The apparatus according to claim 1 wherein said support means comprises a slotted bracket extending outwardly from the printed circuit board and being secured onto support studs on the instrument and hand tightenable fastener means for the studs for securing the support means to the instrument.

7. The apparatus according to claim 1 wherein microphonics is reduced by a factor of five.

8. The apparatus according to claim 7 wherein the microphonics is reduced to about ten counts.

9. The apparatus according to claim 1 further comprising a cover member for the detector.

10. The apparatus according to claim 1 wherein the CEM a detector electrode near its output and the electrically conductive mounting means comprises rigid conductive means secured to the circuit board for supporting the detector electrode and output end of the CEM.

11. The apparatus according to claim 10 wherein the mounting means comprises a signal electrode and a bias electrode.

12. The apparatus according to claim 1 wherein the mounting means comprises means for removably securing the CEM to the circuit board without disassembly thereof.

* * * * *